(12) United States Patent
Ree et al.

(10) Patent No.: US 7,479,509 B2
(45) Date of Patent: Jan. 20, 2009

(54) LOW DIELECTRIC ORGANOSILICATE POLYMER COMPOSITE

(75) Inventors: Moonhor Ree, Pohang (KR); Weontae Oh, Pohang (KR); Yong Taek Hwang, Pohang (KR); Byeongdu Lee, Pohang (KR)

(73) Assignee: Postech Foundation, Pohang (KR)

( * ) Notice: Subject to any disclaimer, the term of this patent is extended or adjusted under 35 U.S.C. 154(b) by 516 days.

(21) Appl. No.: 10/530,815

(22) PCT Filed: Aug. 20, 2004

(86) PCT No.: PCT/KR2004/002104

§ 371 (c)(1),
(2), (4) Date: Apr. 8, 2005

(87) PCT Pub. No.: WO2005/019303

PCT Pub. Date: Mar. 3, 2005

(65) Prior Publication Data

US 2006/0014845 A1    Jan. 19, 2006

(30) Foreign Application Priority Data

Aug. 21, 2003    (KR) .................... 10-2003-0057992

(51) Int. Cl.
*C08G 18/00*    (2006.01)
*C08F 20/00*    (2006.01)
*H01L 21/76*    (2006.01)

(52) U.S. Cl. .................... 521/154; 436/409; 525/447

(58) Field of Classification Search .................... 528/36; 521/154; 525/447
See application file for complete search history.

(56) References Cited

U.S. PATENT DOCUMENTS

| 4,652,467 A | 3/1987 | Brinker et al. |
| 5,378,790 A | 1/1995 | Michalczyk et al. |

(Continued)

FOREIGN PATENT DOCUMENTS

| JP | 2001-151834 | 6/2001 |
| JP | 2002-016057 | 1/2002 |

(Continued)

OTHER PUBLICATIONS

Korean Office Action for Application No. KR2005-518200, 2 pages.

*Primary Examiner*—Mark Eashoo
*Assistant Examiner*—Melissa Winkler
(74) *Attorney, Agent, or Firm*—Rothwell, Figg, Ernst & Manbeck

(57) ABSTRACT

Provided are a porous organosilicate polymer composite prepared by heating an organic/inorganic hybrid polymer in which an organosilicate polymer is chemically bonded to a radial pore-forming polymer ended with a hydrolyzable alkoxysilyl group and used as a core molecule, and a semiconductor device using an organosilicate polymer composite film including the porous organosilicate polymer composite. The organosilicate polymer composite film has a very low dielectric constant, and thus, is useful as a dielectric film of the semiconductor device.

12 Claims, 7 Drawing Sheets

U.S. PATENT DOCUMENTS

| | | | |
|---|---|---|---|
| 5,418,301 A * | 5/1995 | Hult et al. | 525/437 |
| 6,107,357 A | 8/2000 | Hawker et al. | |
| 6,495,479 B1 | 12/2002 | Wu et al. | |
| 2001/0053840 A1 * | 12/2001 | Ko et al. | 528/36 |
| 2001/0055891 A1 | 12/2001 | Ko et al. | |
| 2002/0081794 A1 * | 6/2002 | Ito | 438/200 |

FOREIGN PATENT DOCUMENTS

| | | |
|---|---|---|
| JP | 2002-212502 | 7/2002 |
| JP | 2003-040998 | 2/2003 |
| JP | 2003-064270 | 3/2003 |
| KR | 2001-0098378 | 8/2001 |
| KR | 10-2005-0000831 | 6/2005 |

* cited by examiner

LOW DIELECTRIC ORGANOSILICATE POLYMER COMPOSITE

CROSS REFERENCE TO RELATED APPLICATION

This application is a 35 U.S.C. § 371 National Phase Entry Application from PCT/KR2004/002104, filed Aug. 20, 2004, and designating the U.S.

TECHNICAL FIELD

The present invention relates to a nanoporous organosilicate polymer composite and an organosilicate polymer composite film including the same. More particularly, the present invention relates to an ultra-low dielectric, nanoporous organosilicate polymer composite prepared from a single precursor of an organic/inorganic hybrid polymer, which can make high performance integrated circuits used for main devices of information transmission, processing, and storage systems, and an organosilicate polymer composite film including the same.

BACKGROUND ART

To provide improved performance and cost-effectiveness of multilayer integrated circuits in the electronic field, a recent trend is to increase the density of the multilayer integrated circuits, for example increase the number of memories and logic chips. For this, a chip size has decreased. At the same time, a significant effort has been made in developing a new dielectric material that can decrease the dielectric constant of a dielectric film. A low dielectric film material recently used is silicon dioxide with a dielectric constant of about 3.5 to 4.0. The silicon dioxide has a physical strength and thermal stability sufficient to withstand various chemical or thermal processes related to a semiconductor fabrication method.

However, recent high performance multilayer integrated circuits require a relatively inexpensive copper conductor with excellent conductivity and a new low dielectric material that can satisfy a dielectric constant of 2.5 or less. Signal retardation and cross-talk phenomena accompanied by a decrease in the size of an integrated circuit act as serious blocking factors against device performance improvement. To solve such signal retardation and cross-talk problems, studies about a low dielectric material have been actively done. Development of an ultra-low dielectric material requires introduction of nanoscale pores into a dielectric material or film. For this, a thermal decomposition of an organic polymer that can form nanoscale pores is mainly used. However, a recent technology is difficult to control the size and distribution of nanoscale pores to an ideal level. This is because there arise a phase separation phenomenon between a dielectric material and a pore-forming polymer, and thus, the problem of lack of uniformity of the size and distribution of pores.

Recently, there have been done many studies to develop low dielectric materials based on silicate- and nanoporous silicate- polymers, aromatic polymers, fluorinated aromatic polymers, organic/inorganic composite materials, and the like. In addition to a dielectric constant of 2.5 or less, development of ultra-low dielectric materials also requires improvements of characteristics necessary for a semiconductor device fabrication process and the durability of semiconductor devices, such as thermal stability, mechanical properties, chem.-mech polishing compatibility, etching property, interface compatibility, and electrical properties.

DISCLOSURE OF THE INVENTION

The present invention provides a dielectric material with a low dielectric constant which is excellent in various characteristics necessary for a semiconductor device fabrication process and durability of a semiconductor device, and a semiconductor device comprising a dielectric film made of the same.

According to an aspect of the present invention, there is provided a porous organosilicate polymer composite prepared by heating an organic/inorganic hybrid polymer in which an organosilicate polymer is chemically bonded to a radial pore-forming polymer ended with a hydrolyzable alkoxysilyl group and used as a core molecule.

According to another aspect of the present invention, there is provided a semiconductor device using an organosilicate polymer composite film comprising an organosilicate polymer composite.

The organosilicate polymer composite film has an ultra-low dielectric constant of 1.40 to 2.00.

BEST MODE FOR CARRYING OUT THE INVENTION

Figure 1:
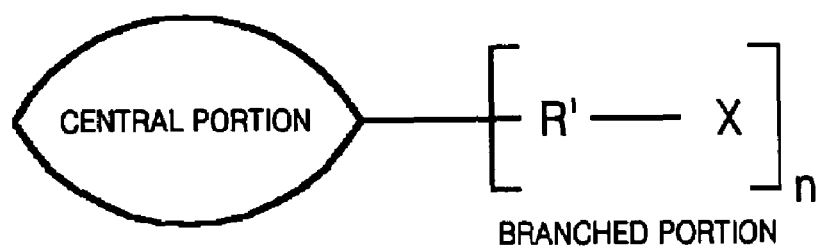
FIG. 1 is a schematic view that illustrates the structure of a radial polymer according to the present invention.

Hereinafter, the present invention will be described in detail.

The present invention provides a copolymer obtained by chemically bonding an organosilicate polymer to an organic pore-forming polymer that can form nanoscale pores and a preparation method thereof. The present invention also provides a method for preparing an ultra-low dielectric, nanoporous organosilicate polymer composite or organosilicate polymer composite film using the copolymer as a precursor. The nanoporous organosilicate polymer composite and the organosilicate polymer composite film can have a constant pore size of several nanometers (5-10 nm in diameter). Furthermore, phase separation between the organosilicate polymer and the pore-forming polymer can be prevented, which enables uniform distribution of pores in the organosilicate polymer composite and the organosilicate polymer composite film.

An organic/inorganic hybrid polymer according to the present invention is prepared by the following process.

First, a radial pore-forming polymer and an organosilicate polymer are mixed and a solvent is added thereto to form a uniform mixture. The solvent may be tetrahydrofuran, toluene, 1,3-dioxane, 1,4-dioxane, ethanol, or a mixture thereof. A mixed solvent of toluene and ethanol (1:1 by volume) is preferable. Preferably, the solvent is used in an amount of 500 to 1,500 parts by weight, based on the total weight (100 parts by weight) of the radial pore-forming polymer and the organosilicate polymer. A desired pore distribution in a finally obtained organic/inorganic hybrid polymer can be accomplished by appropriately adjusting the mixture weight ratio of the radial pore-forming polymer and the organosilicate polymer. Preferably, the mixture weight ratio between the radial pore-forming polymer and the organosilicate polymer is in a range of 1:99 to 40:60. If the ratio of the radial pore-forming polymer is outside the range, formation of nanoscale pores may be difficult. Furthermore, gelation of a synthesized hybrid polymer may easily occur, which renders the creation of a uniform solution of it in a solvent difficult.

Next, an acid catalyst is added to the uniform mixture to appropriately adjust the pH of the mixture.

The acid catalyst may be hydrochloric acid, nitric acid, or sulfuric acid. Preferably, the acid catalyst is an aqueous solution of hydrochloric acid with pH of 1.0 to 3.0. An aqueous solution of hydrochloric acid with pH 2.0 is used in a volume corresponding to 2 to 4 times of the total weight of the organosilicate polymer.

If the pH of the aqueous solution of hydrochloric acid exceeds 3.0, sol-gel polymerization may be retarded, which makes it difficult to prepare a hybrid polymer with an appropriate molecular weight range. On the other hand, if it is less than 1.0, sol-gel polymerization may be excessively carried out, which causes easy creation of a polymer gel that is not dissolved in the solvent.

The reaction mixture that has been adjusted to a desired pH by the addition of the acid catalyst is stirred at room temperature for about one hour. Then, the reaction mixture is raised to a temperature of 40 to 80° C. and stirred for 3 to 6 days. If the reaction temperature is too high or the reaction duration is too long, excessive polymerization may occur, thereby creating an insoluble polymer gel. On the other hand, if the reaction temperature is too low or the reaction duration is too short, it may be difficult to prepare a hybrid polymer with an appropriate molecular weight.

Through the above-described preparation process, a reactive trialkoxysilyl group of the radial pore-forming polymer and a reactive alkoxysilyl group of the organosilicate polymer are subjected to hydrolysis and dehydrocondensation, to thereby form a chemical linkage between the radial pore-forming polymer and the organosilicate polymer.

Thereafter, the resultant solution is cooled to room temperature and a distilled water is then added thereto to remove the acid catalyst. A desired organic/inorganic hybrid polymer can be obtained through an appropriate separation process.

Figure 2:
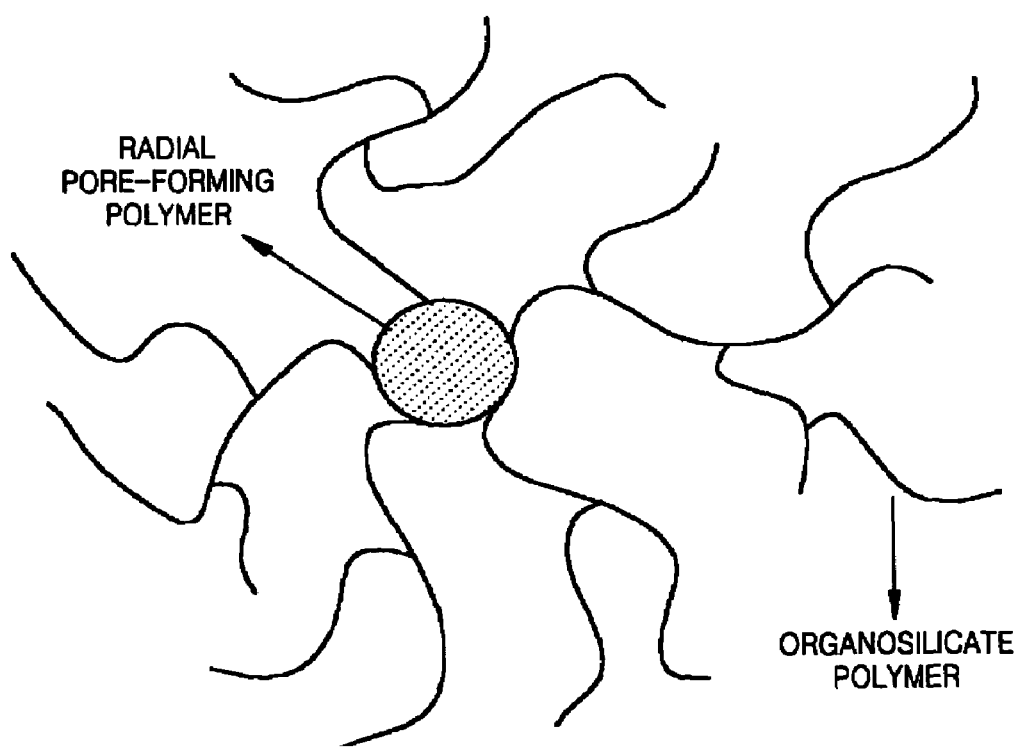
FIG. 2 is a schematic view that illustrates the structure of an organic/inorganic hybrid polymer according to the present invention.

The organic/inorganic hybrid polymer has a structure of chemical linkage between the pure radial pore-forming polymer as a core molecule and the organosilicate polymer, as shown in FIG. 2.

The separation process can be selected according to the types of the radial pore-forming polymer and the organosilicate polymer used starting materials, but is preferably carried out by the following procedure.

An excess desiccant such as anhydrous $Na_2SO_4$ is added to the resultant solution to remove a residual moisture. Then, a solvent is removed from the resultant product under a reduced pressure to separate an organic/inorganic hybrid polymer having a high viscosity radial pore-forming polymer as a core molecule. A solvent such as pentane is then added to the separated organic/inorganic hybrid polymer to remove a trace of a reaction solvent and dried to obtain the pure organic/inorganic hybrid polymer.

The radial pore-forming polymer as used herein has a structure as shown in FIG. 1. Referring to FIG. 1, the radial pore-forming polymer includes a central portion and a branch portion. The branch portion has an end functional group X. The end functional group is a hydrolyzable alkoxysilyl group that can chemically bond to the organosilicate polymer. R' of the branch portion may be formed by ring-opening polymerization of one of cyclic organic monomers represented by Formulae 1A through 1D:

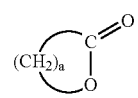

Formula 1A

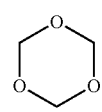

Formula 1B

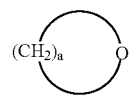

Formula 1C

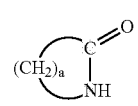

Formula 1D wherein a is 2 to 5.

That is, the radial pore-forming polymer of the present invention can be prepared by ring-opening polymerization of one of the cyclic organic monomers represented by Formulae 1A through 1D in the presence of polyol, $R\!-\!(OH)_k (k \geq 2)$, followed by reaction with a methoxysilane or ethoxysilane compound. Preferably, the polyol is di(trimethylolpropane), di(pentaerythritol), or a derivative thereof.

Examples of the hydrolyzable alkoxysilyl group include —OCONH—$(CH_2)_3$ —Si$(OC_2H_5)_3$, —OCH$_2$CH(CH$_3$)— CH$_2$O(CH$_2)_3$—Si(CH$_3)_2$(OC$_2$H$_5$), —OCH$_2$CH(OH)— CH$_2$O(CH$_2)_3$—Si(CH$_3$)(OC$_2$H$_5)_2$, and —OCH$_2$CH(OH)— CH$_2$O(CH$_2)_3$—Si(CH$_3$)(OCH$_3)_2$.

The central portion of the radial pore-forming polymer has an ether structure selected from the group consisting of aliphatic ethers of C1-C30 and aromatic ethers of C6-C30. Concrete example of the ether includes di(trimethylolpropane), di(pentaerythritol), or a derivative thereof having several end hydroxyl groups.

The radial pore-forming polymer as used herein is prepared by the following procedure: first, ring-opening polymerization between the polyol constituting the central portion and one of the cyclic organic monomers represented by Formulae 1A through 1D is performed to obtain a radial polymer in which X of FIG. 1 is a hydroxy group (—OH). Then, the radial polymer reacts with a silane comound having an alkoxy group to convert the hydroxyl group into a reactive alkoxysilyl group.

The radial pore-forming polymer has an ether structure with an end methoxysilyl or ethoxysilyl group represented by the following Formula 4:

$$_n(X)R\!-\!O\!-\!R(X)_n$$

Formula 4 wherein n is 2 to 64, R is derived from the polyol, $R\!-\!(OH)_k(k \geq 2)$, X is an end functional group selected from —OCONH—$(CH_2)_3$—Si$(OC_2H_5)_3$, —OCH$_2$CH(CH$_3$)—

$CH_2O(CH_2)_3-Si(CH_3)_2(OC_2H_5)$, $-OCH_2CH(OH)-CH_2O(CH_2)_3-Si(CH_3)(OC_2H_5)_2$, and $-OCH_2CH(OH)-CH_2O(CH_2)_3-Si(CH_3)(OCH_3)_2$.

The radial pore-forming polymer may be represented by the following Formula 5:

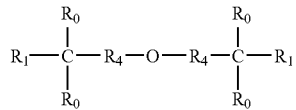

Formula 5 wherein $R_0$ is $-CH_2O-[CO-(CH_2)_5-O]_a-X$ and $R_1$ is $-C_2H_5$ or $-CH_2O-[CO-(CH_2)_5-O]_a-X$ where X is a substituent selected from $-OCONH-(CH_2)_3-Si(OC_2H_5)_3$, $-OCH_2CH(CH_3)-CH_2O(CH_2)_3-Si(CH_3)_2(OC_2H_5)$, $-OCH_2CH(OH)-CH_2O(CH_2)_3-Si(CH_3)(OC_2H_5)_2$, and $-OCH_2CH(OH)-CH_2O(CH_2)_3-Si(CH_3)(OCH_3)_2$ and a is 2 to 20, and $R_4$ is a substituted or unsubstituted alkylene group of C1-C30 or a substituted or unsubstituted arylene group of C6-C30.

Preferably, the radial pore-forming polymer is represented by the following Formula 2 or 3:

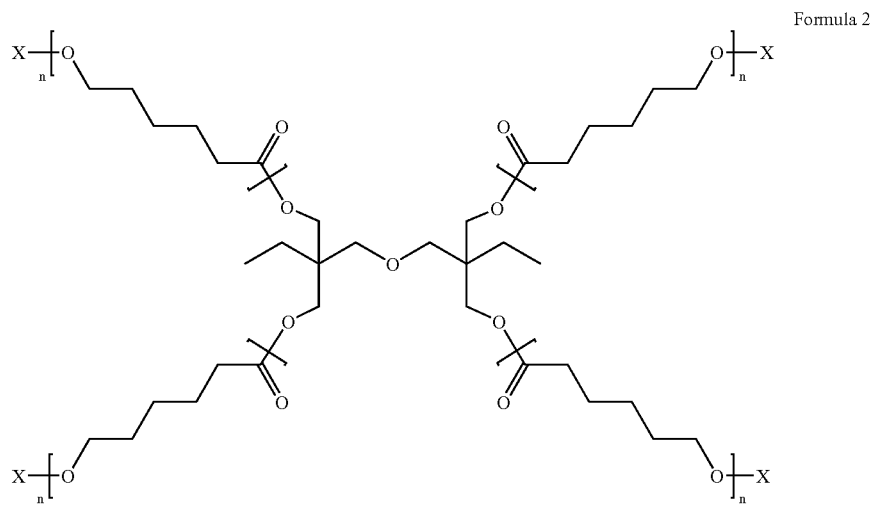

Formula 2 wherein X is $-CONH-(CH_2)_3-Si(OC_2H_5)_3$, $-CH_2CH(CH_3)-CH_2O(CH_2)_3-Si(CH_3)_2(OC_2H_5)$, $-CH_2CH(OH)-CH_2O(CH_2)_3-Si(CH_3)(OC_2H_5)_2$, or $-CH_2CH(OH)-CH_2O(CH_2)_3-Si(CH_3)(OCH_3)_2$, and n is 2 to 20,

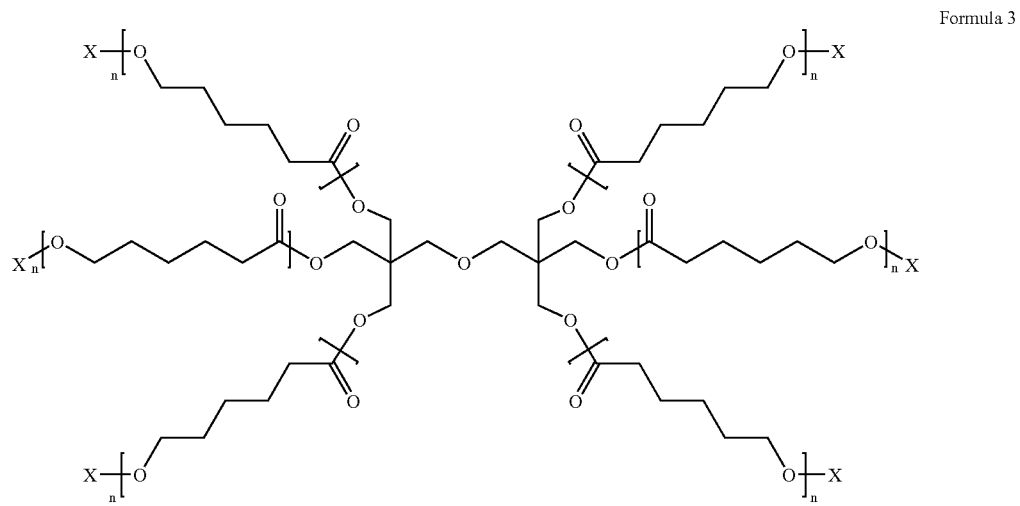

Formula 3 wherein X is —CONH—$(CH_2)_3$—$Si(OC_2H_5)_3$, —$CH_2CH(CH_3)$—$CH_2O(CH_2)_3$—$Si(CH_3)_2(OC_2H_5)$, —$CH_2CH(OH)$—$CH_2O(CH_2)_3$—$Si(CH_3)(OC_2H_5)_2$, or —$CH_2CH(OH)$—$CH_2O(CH_2)_3$—$Si(CH_3)(OCH_3)_2$, and n is 2 to 20.

A radial pore-forming polymer and a preparation method thereof disclosed in Korean Patent Application No. 2003-0041384, filed by the present applicant, can be incorporated herein in its entirety by reference.

The organosilicate polymer as used herein has a silicon atom with hydrogen, a methyl group, or an ethyl group, and a reactive end alkoxy group with 1 to 5 carbon atoms such as a hydrolyzable methoxy or ethoxy group. The organosilicate polymer has a weight average molecular weight (Mw) of 3,000-20,000 g/mol.

The organosilicate polymer is not particularly limited but may be that obtained by a sol-gel method based on hydrolysis, dehydolysis, and polycondensation of one or more silane compounds. Here, the silane compounds are selected from the group consisting of trichlorosilane, methyltriethoxysilane, methyltrimethoxysilane, methyldiethoxysilane, methyldimethoxysilane, ethyltriethoxysilane, ethyltrimethoxysilane, ethyldiethoxysilane, ethyldimethoxysilane, bistrimethoxysilylethane, bistriethoxysilylethane, bistriethoxysilylmethane, bistriethoxysilyloctane, and bistrimethoxysilylhexane. Methyl silsesquioxene, hydrogen silsesquioxene, or ethyl silsesquioxene may also be used as the organosilicate polymer.

An organic/inorganic hybrid polymer prepared by the above-described method has a weight average molecular weight of 3,000-100,000 g/mol. According to the analytic result of a nuclear magnetic resonance (NMR) spectrum, the organic/inorganic hybrid polymer includes 1 to 50 wt % of the radial polymer and 50 to 99 wt % of the organosilicate polymer.

The organic/inorganic hybrid polymer with the above characteristics is used as a single precursor for preparation of low dielectric nanoporous organosilicate polymer composite and organosilicate polymer composite film.

The low dielectric organosilicate polymer composite can be obtained by heating the organic/inorganic hybrid polymer having 1 to 50 wt % of the radial pore-forming polymer at 200 to 500° C. so that sol-gel curing and pore formation are carried out.

The low dielectric organosilicate polymer composite film can be obtained by spin-coating a uniform solution of the organic/inorganic hybrid polymer in an organic solvent on a substrate followed by heating at 200 to 500° C. for curing and pore formation. Here, the organic solvent may be methylisobutylketone, acetone, methylethylketone, toluene, or a mixture thereof, and may be used in an amount of 50 to 99 parts by weight, based on 100 parts by weight of the organic/inorganic hybrid polymer.

Preferably, the heating is carried out under an inert gas (nitrogen or argon, for example) or vacuum atmosphere. There are no limitations on the substrate provided that it is used as a support member. For example, the substrate may be a silicon substrate or a glass substrate.

During the heating, an organosilicate moiety of the organic/inorganic hybrid polymer is cured by sol-gel method. On the other hand, a radial pore-forming polymer moiety is thermally decomposed to form nanoscale pores. A chemical linkage between the radial pore-forming polymer and the organosilicate polymer can prevent phase separation of the radial pore-forming polymer during the thermal curing process. Therefore, the pores formed by the thermal decomposition can be controlled to a nanoscale level and be uniformly distributed in a completely cured organosilicate polymer. The porosity of the organosilicate polymer composite thus prepared varies depending on the initial content of the radial pore-forming polymer. Generally, the organosilicate polymer composite has a refractive index of 1.40-1.20 at a wavelength of 633 nm, a porosity of 1-40%, and a dielectric constant of 1.40-2.00.

The thickness of the organosilicate polymer composite film can be controlled by adjusting the concentration of the organic/inorganic hybrid polymer in the uniform solution and the rotation speed of the spin-coating.

As described above, an organic/inorganic hybrid polymer according to the present invention has a radial pore-forming polymer. Therefore, nanoscale pores can be uniformly formed in an organosilicate polymer composite and an organosilicate polymer composite film. The nanoporous organosilicate polymer composite can have a very low dielectric constant, and thus, is suitable as a film material, in particular a dielectric film material, for a next generation, ultra-low dielectric semiconductor device. When the organosilicate polymer composite film is used for a semiconductor device, it is preferable to set the thickness of the organosilicate polymer composite film to a range of 50 to 2,000 nm.

EXAMPLES

Hereinafter, the present invention will be described more specifically by Examples. However, the following Examples are provided only for illustrations and thus the present invention is not limited to or by them.

Synthesis Example 1

Radial (ε-caprolactone)Polymer (Mw (Weight Average Molecular Weight)=8,000 g/mol) (X of Formula 2 is —CONH—$(CH_2)_3$—$Si(OC_2H_5)_3$)

40 g (344.5 mmol) of ε-caprolactone and 2 g (8.5 mmol) of di(trimethylol) propane were loaded in a completely dried reactor, stirred, and heated at 110° C. under a nitrogen atmosphere. When a reaction mixture become transparent after being completely molten mixed, 4 mL of 1% toluene solution containing stannous 2-ethylhexanoate of an amount corresponding to 1/100 mole of the di(trimethylol)propane was added thereto. The reactor containing all the reactants was continuously stirred at 110° C. for 24 hours. After the reaction was terminated, a synthesized polymer was dissolved in a small quantity of tetrahydrofuran and a cold methanol was then added thereto to induce precipitation of the polymer. The precipitated polymer was separated and vacuum dried to give a white 4-branched radial polymer (intermediate) (yield: 90% or more) where $M_w$ is 7,000 g/mol and X of Formula 2 is hydrogen.

Figure 8A:
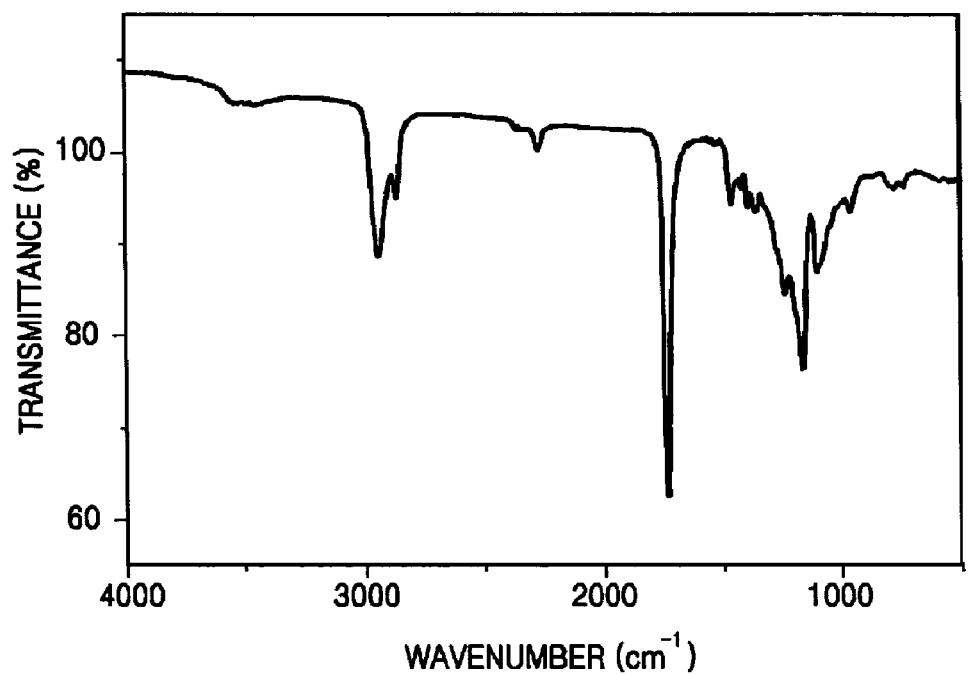
FIGS. 8A-C are respectively a FT-IR spectrum, a $^1H$ NMR spectrum, and a $^{13}C$ NMR spectrum of a radial polymer according to Synthesis Example 1.
Figure 8B:
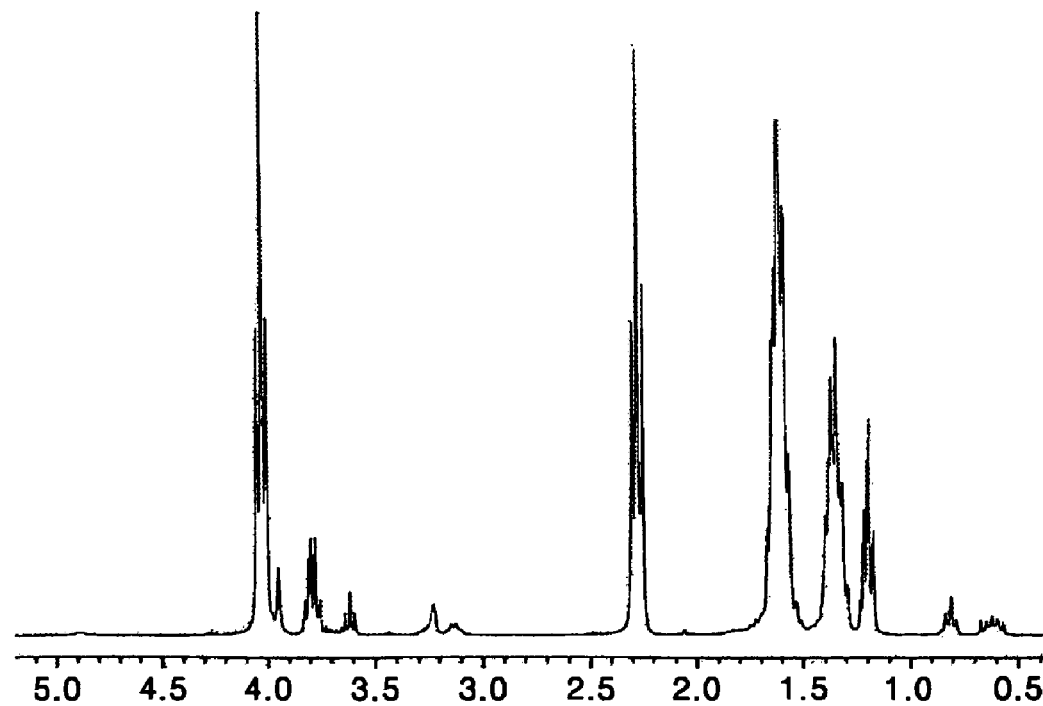
Figure 8C:
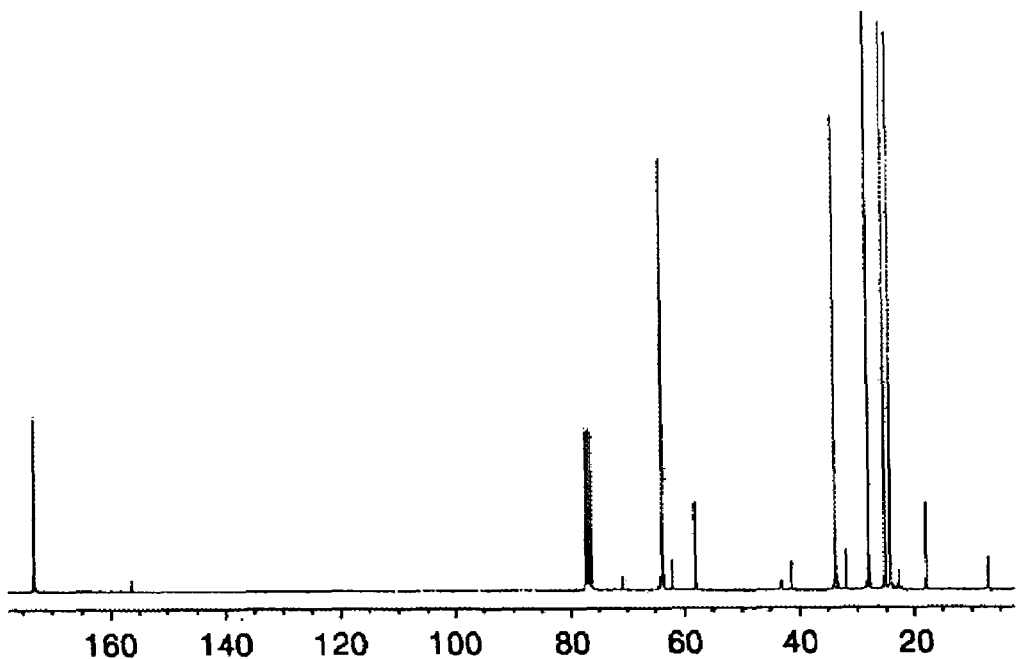

12.0 g of the radial polymer was loaded in a completely dried reactor and 200 mL of tetrahydrofuran was then added thereto. The reaction mixture was completely dissolved by stirring to obtain a transparent and uniform mixed solution. 6.0 g of 3-isocyanatopropyl triethoxysilane was added to the mixed solution and stirred at 60° C. under a nitrogen atmosphere for 48 hours. After the reaction was terminated, a solvent was removed from the resultant solution under a reduced pressure followed by addition of pentane to give a 4-branched radial polymer (polymer A) where $M_w$ is 8,000 g/mol and X of Formula 2 is —CONH—$(CH_2)_3$—$Si(OC_2H_5)_3$ with a reactive end triethoxysilane group. The radial polymer was separated by deposition and then vacuum dried. Yield was 90% or more. The presence of the polymer A was identified by infrared (IR) spectrum and nuclear magnetic resonance (NMR) spectrum (see FIGS. 8A through 8C).

Synthesis Example 2

Radial (ε-caprolactone)Polymer (X of Formula 3 is —CONH—(CH$_2$)$_3$—Si(OC$_2$H$_5$)$_3$)

A white 6-branched radial polymer where X of Formula 3 is hydrogen was synthesized in the same manner as in Synthesis Example 1 except that 20 g (175 mmol) of ε-caprolactone, 0.9 g (3.6 mmol) of di(pentaerythritol), and stannous 2-ethylhexanoate of an amount corresponding to ¹⁄₁₀₀ moles of the di(pentaerythritol) were used. Yield was 90% or more and M$_w$ was 8,000 g/mol.

Figure 9A:
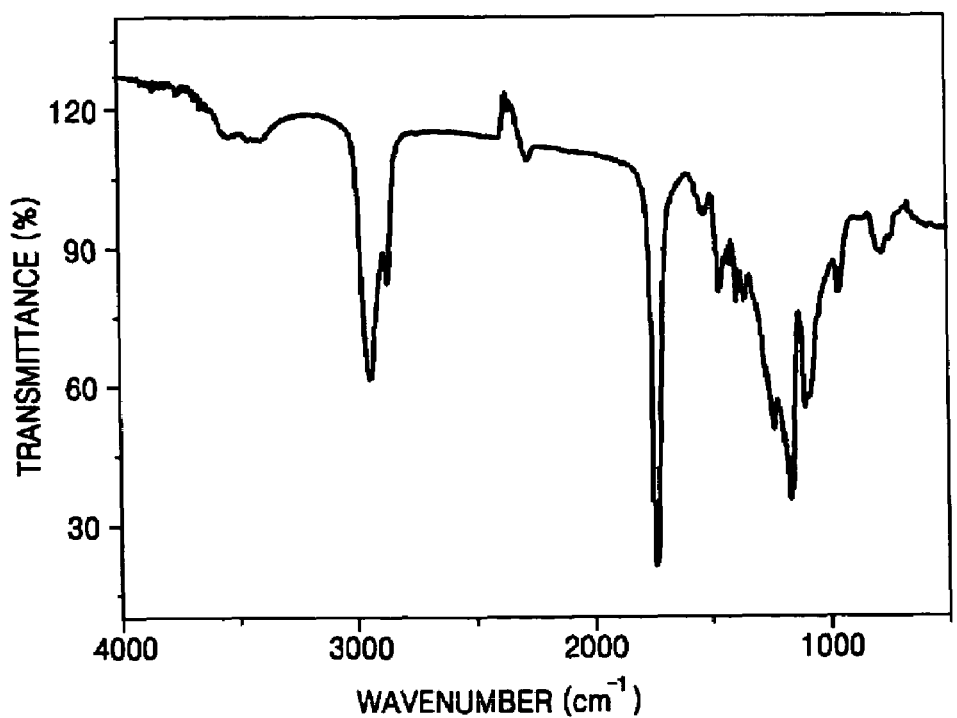
FIGS. 9A-C are respectively a FT-IR spectrum, a $^1H$ NMR spectrum, and a $^{13}C$ NMR spectrum of a radial polymer according to Synthesis Example 2.
Figure 9B:
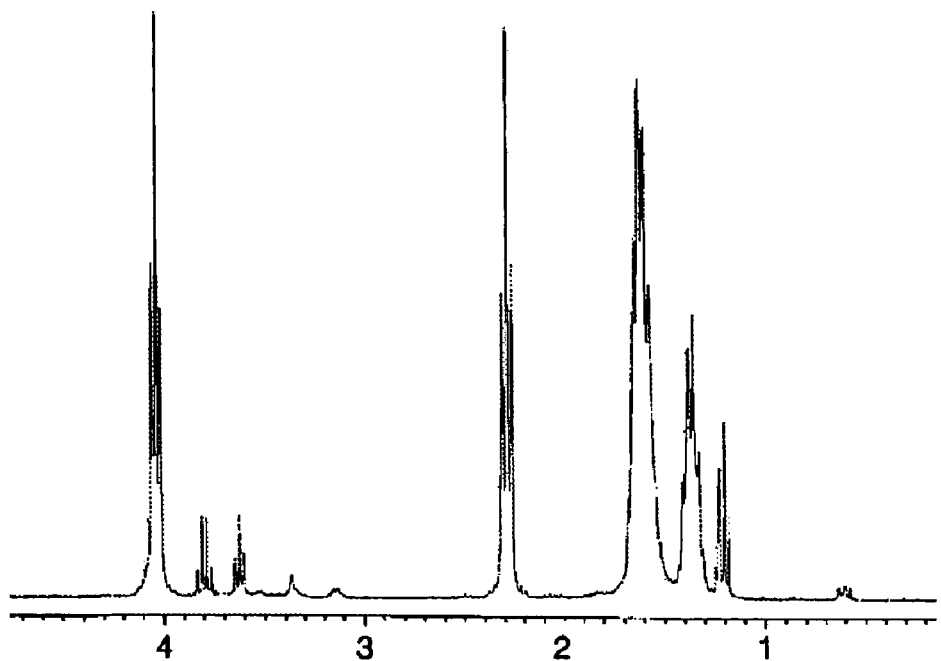
Figure 9C:
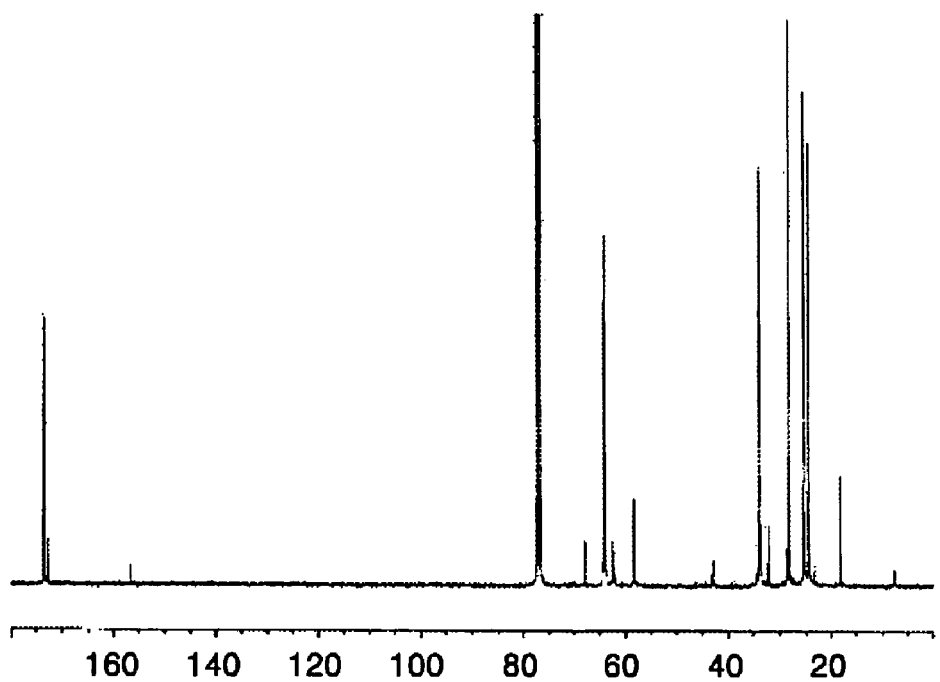

10 g of the radial polymer reacted with 8 g of 3-isocyanatopropyltriethoxysilane in the same manner as in Synthesis Example 1 to give a 6-branched radial polymer (polymer B) where M$_w$ is 9,000 g/mol and X of Formula 3 is —OCONH—(CH$_2$)$_3$—Si(OC$_2$H$_5$)$_3$ with a reactive end triethoxysilane group. Like in Example 1, the presence of the polymer B was identified by NMR and IR (see FIGS. 9A through 9C).

Example 1-1

Preparation of Organic/Inorganic Hybrid Polymer Having Radial (ε-caprolactone)Polymer (X of Formula 2 is —CONH—(CH$_2$)$_3$—Si(OC$_2$H$_5$)$_3$) as Pore-Forming Polymer 1 g of a radial (ε-caprolactone)polymer (M$_w$=8,000 g/mol) (X of Formula 2 is —CONH—CH$_2$)$_3$—Si(OC$_2$H$_5$)$_3$) and 9 g of methyl silsesquioxene (M$_w$=3,000 g/mol) were loaded in a completely dried reactor and 100 mL of a mixed solvent of toluene and ethanol (1:1, by volume) was then added thereto. The reaction mixture was uniformly stirred at room temperature under a nitrogen atmosphere. 30 mL of an aqueous solution of hydrochloric acid (pH 2.0) was gradually added to the reaction mixture.

All the reactants in the reactor were continuously stirred at room temperature for one hour and then maintained at 60° C. for 4 days.

After the reaction was terminated, the resultant solution was cooled to room temperature and a distilled water was then added thereto to remove the hydrochloric acid used as a catalyst by extraction. Then, excess anhydrous Na$_2$SO$_4$ was added to the resultant solution to remove a trace of moisture followed by filtration and removal of a reaction solvent under a reduced pressure to give a high viscosity organic/inorganic hybrid polymer intermediate. The organic/inorganic hybrid polymer intermediate was subjected to removal of a residual solvent by addition of pentane and dried to give an organic/inorganic hybrid polymer (yield: 80%) where M$_w$ is 5,000 g/mol, as shown in FIG. 2.

Figure 4:
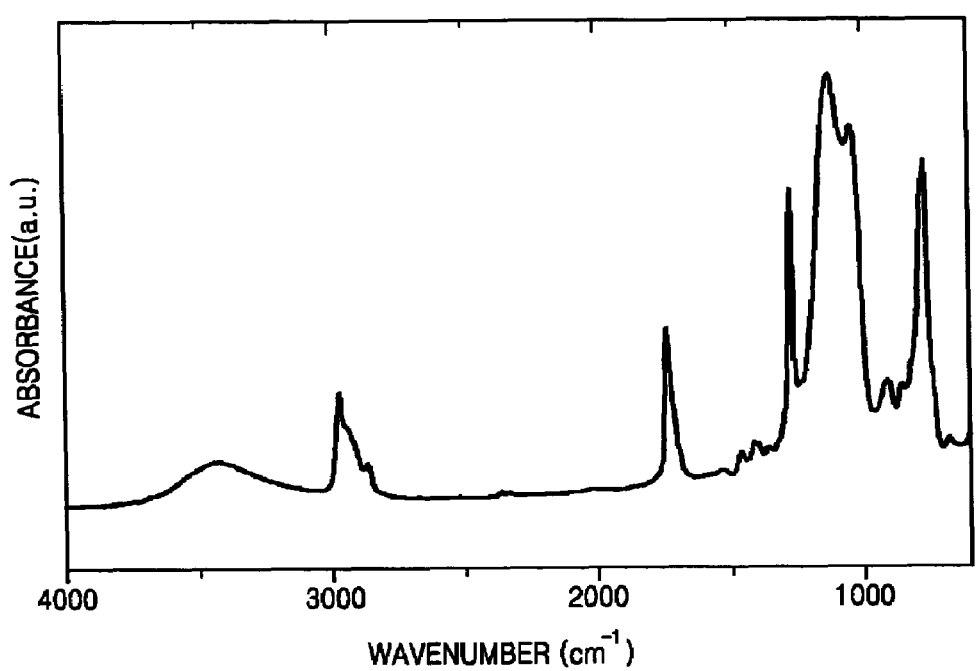
FIG. 4 is an FT-IR spectrum of an organic/inorganic hybrid polymer according to Example 1-1.
Figure 5:
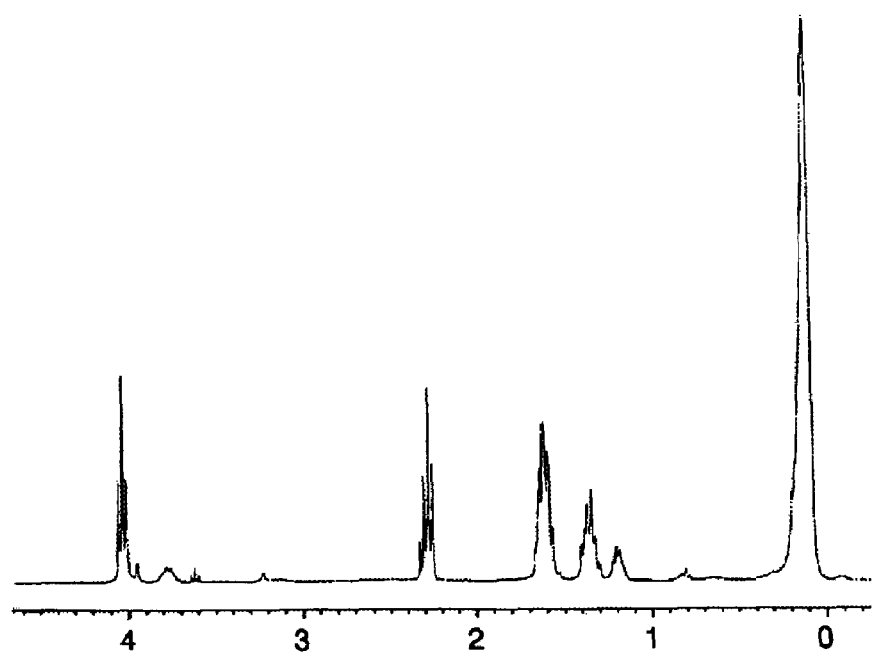
FIG. 5 is a $^1H$ NMR spectrum of the organic/inorganic hybrid polymer according to Example 1-1.

The presence of the organic/inorganic hybrid polymer was identified by IR spectrum, NMR spectrum, and molecular weight measurement (see FIGS. 4 and 5).

Example 1-2

An organic/inorganic hybrid polymer (yield: about 80%, M$_w$: 5,500 g/mol) was prepared in the same manner as in Example 1-1 except that 2 g of the radial (ε-caprolactone) polymer (M$_w$=8,000 g/mol) (X of Formula 2 is —CONH—(CH$_2$)$_3$—Si(OC$_2$H$_5$)$_3$) and 8 g of the methyl silsesquioxene (M$_w$=3,000 g/mol) were used.

Example 1-3

An organic/inorganic hybrid polymer (yield: about 80%, M$_w$: 5,800 g/mol) was prepared in the same manner as in Example 1-1 except that 3 g of the radial (ε-caprolactone) polymer (M$_w$=8,000 g/mol) (X of Formula 2 is —CONH—(CH$_2$)$_3$—Si(OC$_2$H$_5$)$_3$) and 7 g of the methyl silsesquioxene (M$_w$=3,000 g/mol) were used.

Example 2-1

Preparation of Organic/Inorganic Hybrid Polymer Having Radial (ε-caprolactone)Polymer (X of Formula 3 is —CONH—(CH$_2$)$_3$—Si(OC$_2$H$_5$)$_3$) as Pore-Forming Polymer An organic/inorganic hybrid polymer (yield: about 80%, M$_w$: 6,500 g/mol), as shown in FIG. 2, was prepared in the same manner as in Example 1-1 except that 1 g of a radial (ε-caprolactone)polymer (M$_w$=9,000 g/mol) (X of Formula 3 is —CONH—(CH$_2$)$_3$—Si(OC$_2$H$_5$)$_3$) was used instead of 1 g of the radial (ε-caprolactone)polymer (M$_w$=8,000 g/mol) (X of Formula 2 is —CONH—(CH$_2$)$_3$—Si(OC$_2$H$_5$)$_3$).

Figure 6:
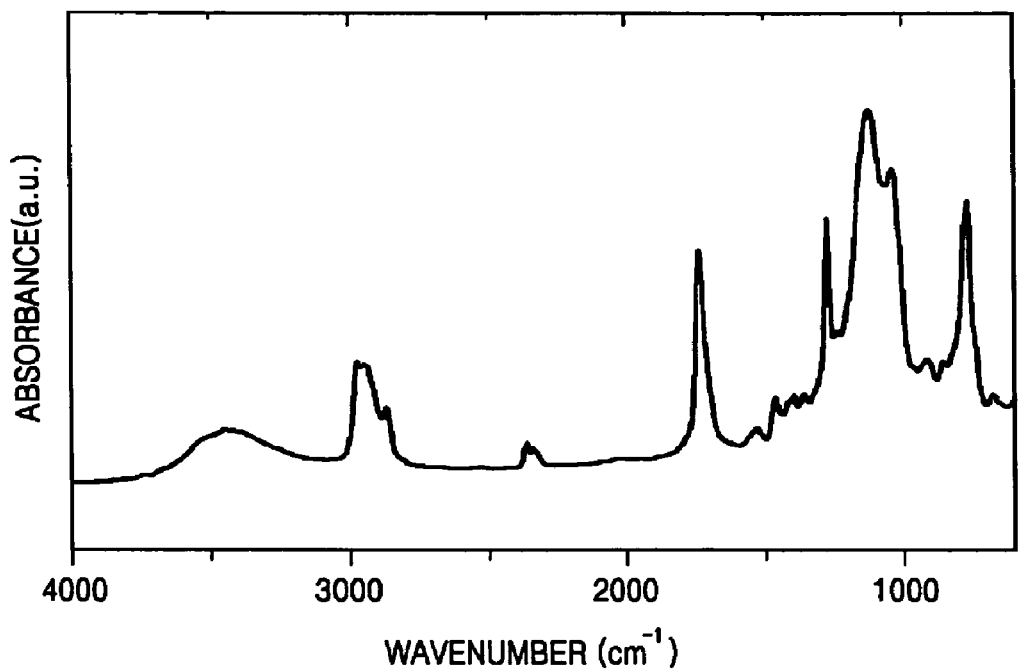
FIG. 6 is an FT-IR spectrum of an organic/inorganic hybrid polymer according to Example 2-1.
Figure 7:
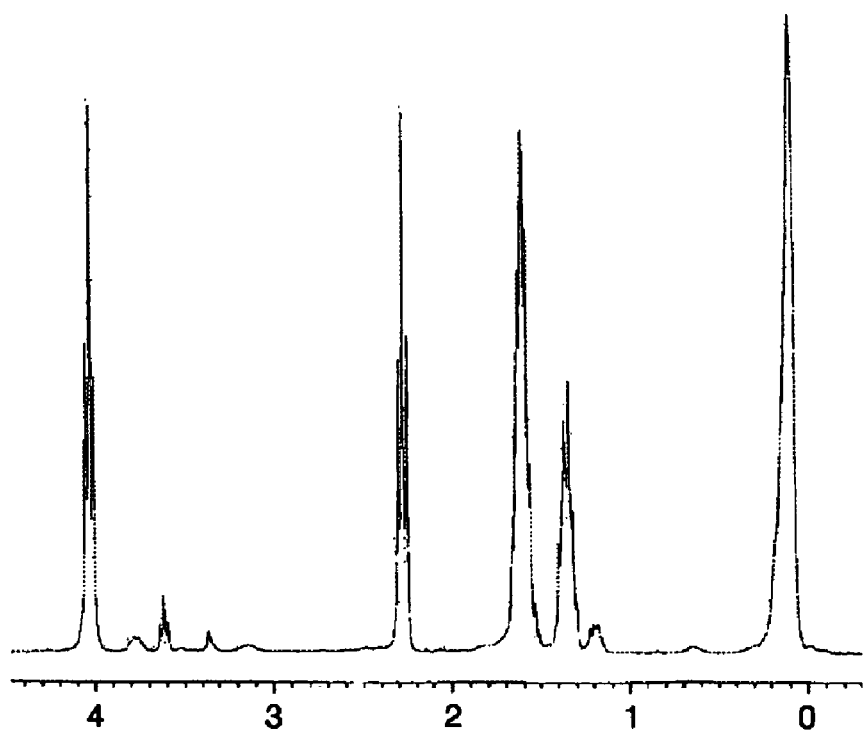
FIG. 7 is a $^1H$ NMR spectrum of the organic/inorganic hybrid polymer according to Example 2-1.

The presence of the organic/inorganic hybrid polymer was identified by IR spectrum, NMR spectrum, and molecular weight measurement (see FIGS. 6 and 7).

Example 2-2

An organic/inorganic hybrid polymer (yield: 80%, M$_w$: 7,000 g/mol) was prepared in the same manner as in Example 2-1 except that 2 g of the radial (ε-caprolactone)polymer (M$_w$=9,000 g/mol) (X of Formula 3 is —CONH—(CH$_2$)$_3$—Si(OC$_2$H$_5$)$_3$) and 8 g of the methyl silsesquioxene (M$_w$=3,000 g/mol) were used.

Example 2-3

An organic/inorganic hybrid polymer (yield: about 80%, M$_w$: 7,700 g/mol) was prepared in the same manner as in Example 2-1 except that 3 g of the radial (ε-caprolactone) polymer (M$_w$=9,000 g/mol) (X of Formula 3 is —CONH—(CH$_2$)$_3$—Si(OC$_2$H$_5$)$_3$) and 7 g of the methyl silsesquioxene (M$_w$=3,000 g/mol) were used.

Example 3-1

Preparation of Organic/Inorganic Hybrid Polymer Having Radial (ε-caprolactone)Polymer Where X of Formula 2 is —OCH$_2$CH(CH$_3$)—CH$_2$O(CH$_2$)$_3$—Si(CH$_3$)$_2$(OC$_2$H$_5$) as Pore-Forming Polymer An organic/inorganic hybrid polymer (yield: about 80%, M$_w$: 5,000 g/mol), as shown in FIG. 2, was prepared in the same manner as in Example 1-1 except that a radial (ε-caprolactone) polymer where X of Formula 2 is —OCH$_2$CH(CH$_3$)—CH$_2$O(CH$_2$)$_3$—Si(CH$_3$)$_2$(OC$_2$H$_5$) was used instead of the radial (ε-caprolactone)polymer (M$_w$=8,000 g/mol) (X of Formula 2 is —CONH—(CH$_2$)$_3$—Si(OC$_2$H$_5$)$_3$).

Example 3-2

An organic/inorganic hybrid polymer (yield: about 80%, M$_w$: 5,200 g/mol) was prepared in the same manner as in Example 3-1 except that 2 g of the radial (ε-caprolactone) polymer (M$_w$ is 8,000 g/mol) (X of Formula 2 is —OCH$_2$CH $(CH_3)$—$CH_2O(CH_2)_3$—$Si(CH_3)_2(OC_2H_5)$) and 8 g of the methyl silsesquioxene ($M_w$=3,000 g/mol) were used.

Example 3-3

An organic/inorganic hybrid polymer (yield: about 80%, $M_w$: 6,000 g/mol) was prepared in the same manner as in Example 3-1 except that 3 g of the radial (ε-caprolactone) polymer (X of Formula 2 is —$OCH_2CH(CH_3)$—$CH_2O$ $(CH_2)_3$—$Si(CH_3)_2(OC_2H_5)$) and 7 g of the methyl silsesquioxene ($M_w$=3,000 g/mol) were used.

Example 4-1

Preparation of Organic/Inorganic Hybrid Polymer having Radial (ε-caprolactone)Polymer where X of Formula 3 is —$OCH_2CH(CH_3)$—$CH_2O(CH_2)_3$—$Si$ $(CH_3)_2(OC_2H_5)$ as Pore-Forming Polymer An organic/inorganic hybrid polymer (yield: about 80%, $M_w$: 6,400 g/mol), as shown in FIG. 2, was prepared in the same manner as in Example 2-1 except that a radial (ε-caprolactone) polymer ($M_w$=9,100 g/mol) (X of Formula 3 is —$OCH_2CH(CH_3)$—$CH_2O(CH_2)_3$—$Si(CH_3)_2(OC_2H_5)$)) was used instead of the radial (ε-caprolactone) polymer ($M_w$=9,000 g/mol) (X of Formula 3 is —$CONH$—$(CH_2)_3$—$Si$ $(OC_2H_5)_3$).

Example 4-2

An organic/inorganic hybrid polymer (yield: about 80%, $M_w$: 7,000 g/mol) was prepared in the same manner as in Example 4-1 except that 2 g of the radial (ε-caprolactone) polymer ($M_w$=9,100 g/mol) (X of Formula 3 is —$OCH_2CH$ $(CH_3)$—$CH_2O(CH_2)_3$—$Si(CH_3)_2(OC_2H_5)$) and 8 g of the methyl silsesquioxene ($M_w$=3,000 g/mol) were used.

Example 4-3

An organic/inorganic hybrid polymer (yield: about 80%, $M_w$: 7,400 g/mol) was prepared in the same manner as in Example 4-1 except that 3 g of the radial (ε-caprolactone) polymer ($M_w$=9,100 g/mol) (X of Formula 3 is —$OCH_2CH$ $(CH_3)$—$CH_2O(CH_2)_3$—$Si(CH_3)_2(OC_2H_5)$) and 7 g of the methyl silsesquioxene ($M_w$=3,000 g/mol) were used.

Example 5-1

Preparation of Organic/Inorganic Hybrid Polymer having Radial (ε-caprolactone) Polymer where X of Formula 2 is —$CH_2CH(OH)$—$CH_2O(CH_2)_3$—$Si$ $(CH_3)(OC_2H_5)_2$ as Pore-Forming Polymer An organic/inorganic hybrid polymer (yield: about 80%, $M_w$: 5,000 g/mol), as shown in FIG. 2, was prepared in the same manner as in Example 1-1 using 1 g of a radial (ε-caprolactone) polymer ($M_w$=8,100 g/mol) (X of Formula 2 is —$CH_2CH(OH)$—$CH_2O(CH_2)_3$—$Si(CH_3)(OC_2H_5)_2$) and 9 g of the methyl silsesquioxene ($M_w$=3,000 g/mol).

Example 5-2

An organic/inorganic hybrid polymer (yield: about 80%, $M_w$: 5,200 g/mol) was prepared in the same manner as in Example 5-1 except that 2 g of the radial (ε-caprolactone) polymer ($M_w$=8,100 g/mol) (X of Formula 2 is —$CH_2CH$ $(OH)$—$CH_2O(CH_2)_3$—$Si(CH_3)(OC_2H_5)_2$) and 8 g of the methyl silsesquioxene ($M_w$=3,000 g/mol) were used.

Example 5-3

An organic/inorganic hybrid polymer (yield: about 80%, $M_w$: 6,000 g/mol) was prepared in the same manner as in Example 5-1 except that 3 g of the radial (ε-caprolactone) polymer ($M_w$=8,100 g/mol) (X of Formula 2 is —$CH_2CH$ $(OH)$—$CH_2O(CH_2)_3$—$Si(CH_3)(OC_2H_5)_2$) and 7 g of the methyl silsesquioxene ($M_w$=3,000 g/mol) were used.

Example 6-1

Preparation of Organic/Inorganic Hybrid Polymer having Radial (ε-caprolactone) Polymer where X of Formula 3 is —$CH_2CH(OH)$—$CH_2O(CH_2)_3$—$Si$ $(CH_3)(OC_2H_5)_2$ as Pore-Forming Polymer An organic/inorganic hybrid polymer (yield: about 80%, $M_w$: 6,400 g/mol), as shown in FIG. 2, was prepared in the same manner as in Example 1-1 using 1 g of a radial (ε-caprolactone) polymer ($M_w$=9,100 g/mol) (X of Formula 3 is —$CH_2CH(OH)$—$CH_2O(CH_2)_3$—$Si(CH_3)(OC_2H_5)_2$) and 9 g of the methyl silsesquioxene ($M_w$=3,000 g/mol).

Example 6-2

An organic/inorganic hybrid polymer (yield: about 80%, $M_w$: 6,900 g/mol) was prepared in the same manner as in Example 6-1 except that 2 g of the radial (ε-caprolactone) polymer ($M_w$=9,100 g/mol) (X of Formula 3 is —$CH_2CH$ $(OH)$—$CH_2O(CH_2)_3$—$Si(CH_3)(OC_2H_5)_2$) and 8 g of the methyl silsesquioxene ($M_w$=3,000 g/mol) were used.

Example 6-3

An organic/inorganic hybrid polymer (yield: about 80%, $M_w$: 7,400 g/mol) was prepared in the same manner as in Example 6-1 except that 3 g of the radial (ε-caprolactone) polymer ($M_w$=9,100 g/mol) (X of Formula 3 is —$CH_2CH$ $(OH)$—$CH_2O(CH_2)_3$—$Si(CH_3)(OC_2H_5)_2$) and 7 g of the methyl silsesquioxene ($M_w$=3,000 g/mol) were used.

Example 7-1

Preparation of Organic/Inorganic Hybrid Polymer having Radial (ε-caprolactone) Polymer where X of Formula 2 is —$OCH_2CH(OH)$—$CH_2O(CH_2)_3$—$Si$ $(CH_3)(OCH_3)_2$ as Pore-Forming Polymer An organic/inorganic hybrid polymer (yield: about 80%, $M_w$: 5,100 g/mol), as shown in FIG. 2, was prepared in the same manner as in Example 6-1 except that a radial (ε-caprolactone) polymer ($M_w$=8,000 g/mol) (X of Formula 2 is —$OCH_2CH(OH)$—$CH_2O(CH_2)_3$—$Si(CH_3)(OCH_3)_2$) was used instead of the radial (ε-caprolactone) polymer (X of Formula 3 is —$CH_2CH(OH)$—$CH_2O(CH_2)_3$—$Si(CH_3)$ $(OC_2H_5)_2$).

Example 7-2

An organic/inorganic hybrid polymer (yield: about 80%, $M_w$: 5,500 g/mol) was prepared in the same manner as in Example 7-1 except that 2 g of the radial (ε-caprolactone) polymer ($M_w$=8,000 g/mol) (X of Formula 2 is —$OCH_2CH$ (OH)—CH$_2$O(CH$_2$)$_3$—Si(CH$_3$)(OCH$_3$)$_2$) and 8 g of the methyl silsesquioxene (M$_w$=3,000 g/mol) were used.

Example 7-3

An organic/inorganic hybrid polymer (yield: about 80%, M$_w$: 6,000 g/mol) was prepared in the same manner as in Example 7-1 except that 3 g of the radial (ε-caprolactone) polymer (M$_w$=8,000 g/mol) (X of Formula 2 is —OCH$_2$CH(OH)—CH$_2$O(CH$_2$)$_3$—Si(CH$_3$)(OCH$_3$)$_2$) and 7 g of the methyl silsesquioxene (M$_w$=3,000 g/mol) were used.

Example 8-1

Preparation of Organic/Inorganic Hybrid Polymer having Radial (ε-caprolactone) Polymer where X of Formula 3 is —OCH$_2$CH(OH)—CH$_2$O(CH$_2$)$_3$—Si(CH$_3$)(OCH$_3$)$_2$ as Pore-Forming Polymer An organic/inorganic hybrid polymer (yield: about 80% or more, M$_w$: 6,200 g/mol), as shown in FIG. 2, was prepared in the same manner as in Example 1-1 using 1 g of a radial (ε-caprolactone) polymer (M$_w$=9,000 g/mol) (X of Formula 3 is —OCH$_2$CH(OH)—CH$_2$O(CH$_2$)$_3$—Si(CH$_3$)(OCH$_3$)$_2$) and 9 g of the methyl silsesquioxene (M$_w$=3,000 g/mol).

Example 8-2

An organic/inorganic hybrid polymer (yield: about 80%, M$_w$: 6,900 g/mol) was prepared in the same manner as in Example 8-1 except that 2 g of the radial (ε-caprolactone) polymer (M$_w$=9,000 g/mol) (X of Formula 3 is —OCH$_2$CH(OH)—CH$_2$O(CH$_2$)$_3$—Si(CH$_3$)(OCH$_3$)$_2$) and 8 g of the methyl silsesquioxene (M$_w$=3,000 g/mol) were used.

Example 8-3

An organic/inorganic hybrid polymer (yield: about 80%, M$_w$: 7,500 g/mol) was prepared in the same manner as in Example 8-1 except that 3 g of the radial (ε-caprolactone) polymer (M$_w$=9,000 g/mol) (X of Formula 3 is —OCH$_2$CH(OH)—CH$_2$O(CH$_2$)$_3$—Si(CH$_3$)(OCH$_3$)$_2$) and 7 g of the methyl silsesquioxene (M$_w$=3,000 g/mol) were used.

The following Examples show formation of ultra-low dielectric films using the organic/inorganic hybrid polymers according to the above Examples as single precursors.

Example 9-1

Formation of Ultra-Low Dielectric Organosilicate Polymer Composite Film 1 g of the organic/inorganic hybrid polymer of Example 1-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm.

Figure 3:
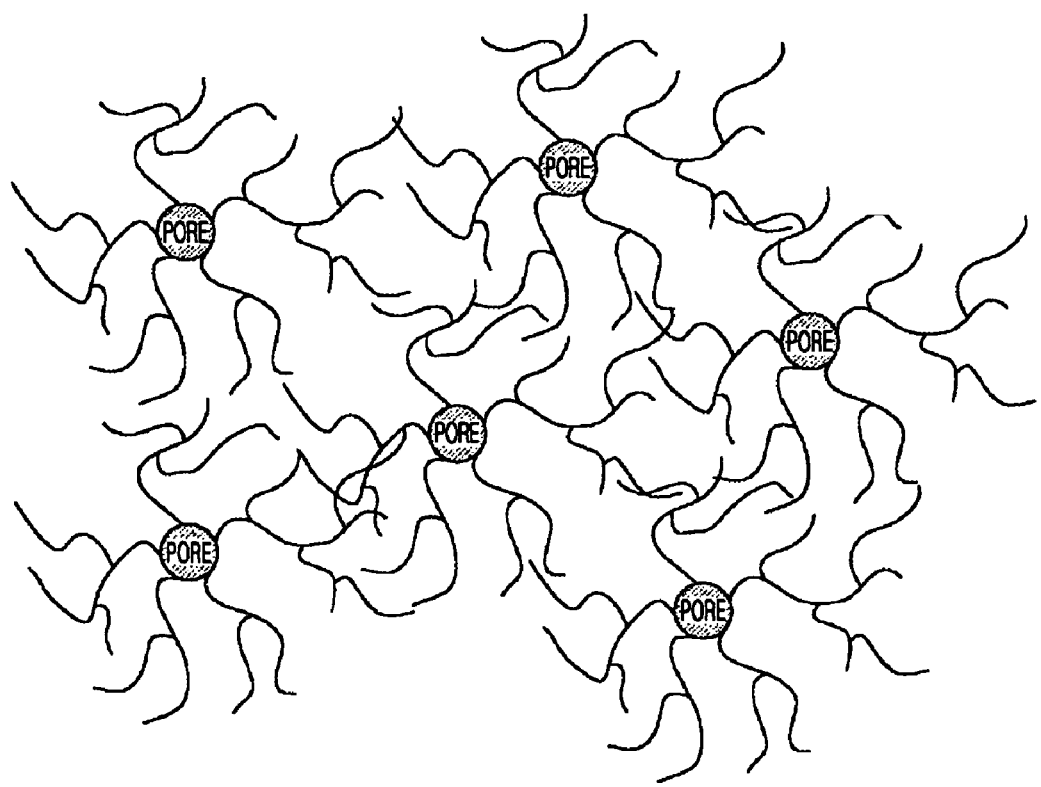
FIG. 3 is a schematic view that illustrates the structure of a nanoporous organosilicate polymer composite according to the present invention.

The thin film thus prepared was raised to 400° C. under a nitrogen atmosphere at a rate of 2° C./min and maintained at the same temperature for 60 minutes. At this time, the organosilicate polymer contained in the thin film was thermally cured and the radial pore-forming polymer was thermally decomposed at 250° C. or more to form pores in the thin film. After the thermal treatment, the thin film was cooled at the same rate as the temperature raising rate to give a nanoporous organosilicate polymer composite film with an ultra-low dielectric constant as shown in FIG. 3.

A thin film made of only methyl silsesquioxene has a refractive index of about 2.30-3.00. Polymer composite films according to Examples of the present invention had a relatively low refractive index due to the presence of nanoscale pores, as compared to the thin film made of only methyl silsesquioxene.

The nanoporous organosilicate polymer composite film of this Example had a dielectric constant of 2.140±0.020.

Example 9-2

An organosilicate polymer composite film was formed in the same manner as in Example 9-1 except that 1 g of the organic/inorganic hybrid polymer of Example 1-2 was used instead of the organic/inorganic hybrid polymer of Example 1-1.

The organosilicate polymer composite film had a dielectric constant of 1.880±0.020.

Example 9-3

An organosilicate polymer composite film was formed in the same manner as in Example 9-1 except that 1 g of the organic/inorganic hybrid polymer of Example 1-3 was used instead of the organic/inorganic hybrid polymer of Example 1-1.

The organosilicate polymer composite film had a dielectric constant of 1.740±0.040.

Example 10-1

Formation of Ultra-Low Dielectric Organosilicate Polymer Composite Film 1 g of the organic/inorganic hybrid polymer of Example 2-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm.

The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant. The nanoporous organosilicate polymer composite film had a dielectric constant of 2.120±0.020.

Example 10-2

An organosilicate polymer composite film was formed in the same manner as in Example 10-1 except that the organic/inorganic hybrid polymer of Example 2-2 was used instead of the organic/inorganic hybrid polymer of Example 2-1.

The organosilicate polymer composite film had a dielectric constant of 1.850±0.020.

Example 10-3

An organosilicate polymer composite film was formed in the same manner as in Example 10-1 except that the organic/inorganic hybrid polymer of Example 2-3 was used instead of the organic/inorganic hybrid polymer of Example 2-1.

Example 11-1

Formation of Ultra-Low Dielectric Organosilicate Polymer Composite Film 1 g of the organic/inorganic hybrid polymer of Example 3-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm.

The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant. The nanoporous organosilicate polymer composite film had a dielectric constant of 2.040±0.020.

Example 11-2

An organosilicate polymer composite film was formed in the same manner as in Example 11-1 except that 1 g of the organic/inorganic hybrid polymer of Example 3-2 was used instead of the organic/inorganic hybrid polymer of Example 3-1.

The organosilicate polymer composite film had a dielectric constant of 1.810±0.020.

Example 11-3

An organosilicate polymer composite film was formed in the same manner as in Example 11-1 except that 1 g of the organic/inorganic hybrid polymer of Example 3-3 was used instead of the organic/inorganic hybrid polymer of Example 3-1.

The organosilicate polymer composite film had a dielectric constant of 1.710±0.040.

Example 12-1

Formation of Ultra-Low Dielectric Organosilicate Polymer Composite Film 1 g of the organic/inorganic hybrid polymer of Example 4-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm.

The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant. The nanoporous organosilicate polymer composite film had a dielectric constant of 2.050±0.020.

Example 12-2

An organosilicate polymer composite film was formed in the same manner as in Example 12-1 except that the organic/inorganic hybrid polymer of Example 4-2 was used instead of the organic/inorganic hybrid polymer of Example 4-1. The organosilicate polymer composite film had a dielectric constant of 1.850±0.020.

Example 12-3

An organosilicate polymer composite film was formed in the same manner as in Example 12-1 except that the organic/inorganic hybrid polymer of Example 4-3 was used instead of the organic/inorganic hybrid polymer of Example 4-1. The organosilicate polymer composite film had a dielectric constant of 1.730±0.040.

Example 13-1

Formation of Ultra-Low Dielectric Organosilicate Polymer Composite Film 1 g of the organic/inorganic hybrid polymer of Example 5-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm.

The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant. The nanoporous organosilicate polymer composite film had a dielectric constant of 1.990±0.020.

Example 13-2

An organosilicate polymer composite film was formed in the same manner as in Example 13-1 except that the organic/inorganic hybrid polymer of Example 5-2 was used instead of the organic/inorganic hybrid polymer of Example 5-1.

The organosilicate polymer composite film had a dielectric constant of 1.820±0.030.

Example 13-3

An organosilicate polymer composite film was formed in the same manner as in Example 13-1 except that the organic/inorganic hybrid polymer of Example 5-3 was used instead of the organic/inorganic hybrid polymer of Example 5-1.

The organosilicate polymer composite film had a dielectric constant of 1.690±0.030.

Example 14-1

Formation of Ultra-Low Dielectric Organosilicate Polymer Composite Film 1 g of the organic/inorganic hybrid polymer of Example 6-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm. The thickness of the thin film can be adjusted by varying the concentration of the mixed solution or the rotation speed of the spin coating. The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant as shown in FIG. 3. The nanoporous organosilicate polymer composite film had a dielectric constant of 2.100±0.030.

Example 14-2

An organosilicate polymer composite film was formed in the same manner as in Example 14-1 except that the organic/inorganic hybrid polymer of Example 6-2 was used instead of the organic/inorganic hybrid polymer of Example 6-1.

The organosilicate polymer composite film had a dielectric constant of 1.805±0.030.

Example 14-3

An organosilicate polymer composite film was formed in the same manner as in Example 14-1 except that the organic/inorganic hybrid polymer of Example 6-2 was used instead of the organic/inorganic hybrid polymer of Example 6-1.

The organosilicate polymer composite film had a dielectric constant of 1.710±0.040.

Example 15-1

1 g of the organic/inorganic hybrid polymer of Example 7-1 was uniformly dissolved in 9 g of methylisobutylketone to prepare a mixed solution. The mixed solution was spin-coated on a silicon substrate at about 1,000-5,000 rpm to form a thin film.

The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant as shown in FIG. 3. The nanoporous organosilicate polymer composite film had a dielectric constant of 2.100±0.020.

Example 15-2

An organosilicate polymer composite film was formed in the same manner as in Example 15-1 except that the organic/inorganic hybrid polymer of Example 7-2 was used instead of the organic/inorganic hybrid polymer of Example 7-1.

The organosilicate polymer composite film had a dielectric constant of 1.830±0.030.

Example 15-3

An organosilicate polymer composite film was formed in the same manner as in Example 15-1 except that the organic/inorganic hybrid polymer of Example 7-3 was used instead of the organic/inorganic hybrid polymer of Example 7-1.

The organosilicate polymer composite film had a dielectric constant of 1.680±0.050.

Example 16-1

Formation of Ultra-Low Dielectric Organosilicate Polymer Composite Film 1 g of the organic/inorganic hybrid polymer of Example 8-1 was uniformly dissolved in 9 g of methylisobutylketone to prepare a mixed solution. The mixed solution was spin-coated on a silicon substrate at about 1,000-5,000 rpm to form a thin film. The thickness of the thin film was about 100 nm.

The thin film thus prepared was raised to 400° C. under a nitrogen atmosphere at a rate of 2° C./min and maintained at the same temperature for 60 minutes. At this time, the radial pore-forming polymer contained in the thin film was thermally decomposed to thereby form pores in the thin film. After the thermal treatment, the thin film was cooled at the same rate as the temperature raising rate to give a nanoporous organosilicate polymer composite film with an ultra-low dielectric constant.

The nanoporous organosilicate polymer composite film had a dielectric constant of 2.110±0.020.

Example 16-2

An organosilicate polymer composite film was formed in the same manner as in Example 16-1 except that the organic/inorganic hybrid polymer of Example 8-2 was used instead of the organic/inorganic hybrid polymer of Example 8-1.

The organosilicate polymer composite film had a dielectric constant of 1.790±0.020.

Example 16-3

An organosilicate polymer composite film was formed in the same manner as in Example 16-1 except that the organic/inorganic hybrid polymer of Example 8-3 was used instead of the organic/inorganic hybrid polymer of Example 8-1.

The organosilicate polymer composite film had a dielectric constant of 1.650±0.040.

INDUSTRIAL APPLICABILITY

An organic/inorganic hybrid polymer of the present invention is prepared by chemical linkage between a radial pore-forming polymer with a reactive end group of FIG. 1 and an organosilicate polymer. The organic/inorganic hybrid polymer can be used as a single precursor for formation of an organosilicate polymer composite and an organosilicate polymer composite film, which have nanoscale pores and a low dielectric constant. The organosilicate polymer composite film can be used as a dielectric film for a semiconductor device.

What is claimed is:

1. A porous organosilicate polymer composite prepared by heating an organic/inorganic hybrid polymer in which an organosilicate polymer is chemically bonded to a radial pore-forming polymer ended with a hydrolyzable alkoxysilyl group and used as a core molecule, wherein the hydrolyzable alkoxysilyl group of the radial pore-forming polymer is $-CONH-(CH_2)_3-Si(OC_2H_5)_3$, $-CH_2CH(CH_3)-CH_2O(CH_2)_3-Si(CH_3)_2(OC_2H_5)$, $-CH_2CH(OH)-CH_2O(CH_2)_3-Si(CH_3)(OC_2H_5)_2$, or $-CH_2CH(OH)-CH_2O(CH_2)_3-Si(CH_3)(OCH_3)_2$.

2. The porous organosilicate polymer composite of claim 1, wherein the heating is carried out at 200 to 500° C.

3. The porous organosilicate polymer composite of claim 1, wherein the organosilicate polymer is chemically bonded to the radial pore-forming polymer by hydrolysis, dehydrolysis, and polycondensation.

4. The porous organosilicate polymer composite of claim 1, wherein the radial pore-forming polymer comprises a branch portion having the hydrolyzable alkoxysilyl group at an end and a central portion linked to the branch portion, and the central portion is formed by an ether selected from aliphatic ethers of $C_1$-$C_{30}$ and aromatic ethers of $C_6$-$C_{30}$.

5. The porous organosilicate polymer composite of claim 4, wherein the central portion of the radial pore-forming polymer is formed using di(trimethylolpropane), di(pentaerythritol), or a derivative thereof having several end hydroxyl groups.

6. The porous organosilicate polymer composite of claim 1, wherein the branch portion of the radial pore-forming polymer is prepared by ring-opening polymerization of one of cyclic compounds represented by Formulae 1A through 1D:

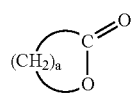

(1A)

(1B)

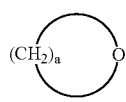

(1C)

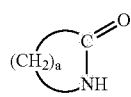

(1D)

wherein a is 2 to 5.

7. The porous organosilicate polymer composite of claim 1, wherein the organosilicate polymer is selected from the group consisting of methyl silsesquioxene, ethyl silsesquioxene, and hydrogen silsesquioxene.

8. The porous organosilicate polymer composite of claim 1, wherein the organosilicate polymer is obtained by hydrolysis, dehydrolysis, and polycondensation of one or more silane compounds, and the silane compounds are selected from the group consisting of trichlorosilane, methyltriethoxysilane, methyltrimethoxysilane, methyldiethoxysilane, methyldimethoxysilane, thyltriethoxysilane, ethyltrimethoxysilane, ethykliethoxysilane, ethyldimethoxysilane, bistrimethoxysilylethane, bistriethoxysilylethane, bistriethoxysilylmethane, bistriethoxysilyloctane, and bistrimethoxysilylhexane.

9. The porous organosilicate polymer composite of claim 1, wherein the radial pore-forming polymer is represented by Formula 2:

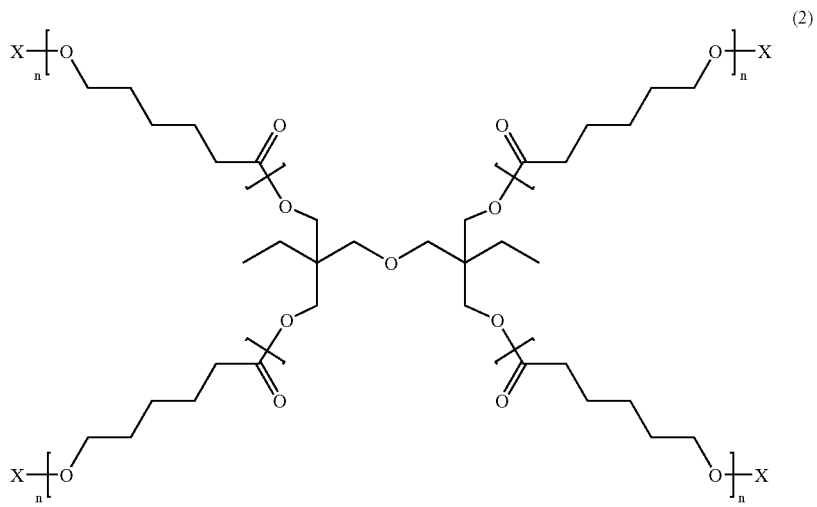

(2)

wherein X is —CONH—$(CH_2)_3$—$Si(OC_2H_5)_3$, —$CH_2CH(CH_3)$—$CH_2O(CH_2)_3$—$Si(CH_3)_2(OC_2H_5)$, —$CH_2CH(OH)$—$CH_2O(CH_2)_3$—$Si(CH_3)(OC_2H_5)_2$ or —$CH_2CH(OH)$—$CH_2O(CH_2)_3$—$Si(CH_3)(OCH_3)_2$, and n is 2 to 20.

10. The porous organosilicate polymer composite of claim 1, wherein the radial pore-forming polymer has a weight average molecular weight of 500-20,000 g/mol and the organosilicate polymer has a weight average molecular weight of 3,000-20,000 g/mol.

11. The porous organosilicate polymer composite of claim 1, wherein the organic/inorganic hybrid polymer has a weight average molecular weight of 3,000 to 100,000 g/mol.

12. The porous organosilicate polymer composite of claim 1, wherein the radial pore-forming polymer is 1 to 50 wt % and the organosilicate polymer is 50 to 99 wt %.

* * * * *